United States Patent [19]

Kobayashi et al.

[11] Patent Number: 4,959,347

[45] Date of Patent: Sep. 25, 1990

[54] FORMING HOMOGENEOUS PRECURSERS OF BI-SR-CA-CU VIA CARBOXYLATES IN THE PRESENCE OF OXIDIZING AGENTS

[75] Inventors: Toshio Kobayashi; Fusaoki Uchikawa; Kenji Nomura, all of Amagasaki, Japan

[73] Assignee: Mitsubishi Denki Kabushiki Kaisha, Tokyo, Japan

[21] Appl. No.: 235,497

[22] Filed: Aug. 24, 1988

[30] Foreign Application Priority Data

Aug. 24, 1987 [JP] Japan .................. 62-210940
Aug. 24, 1987 [JP] Japan .................. 62-210937
Mar. 31, 1988 [JP] Japan .................. 63-81715
Apr. 18, 1988 [JP] Japan .................. 62-96277

[51] Int. Cl.$^5$ .................. H01B 1/06; H01L 39/06
[52] U.S. Cl. .................. 505/1; 252/518; 252/521; 423/593; 505/734; 505/735; 505/782
[58] Field of Search .................. 505/734, 735, 738, 742, 505/1, 782; 252/518, 521; 423/593, 1

[56] References Cited

U.S. PATENT DOCUMENTS 4,804,649  2/1989  Sherif .................. 505/1
4,863,521  9/1989  Block .................. 505/1

OTHER PUBLICATIONS

Garland, M. M. Appl. Phys. Letts, 52 (May 30) 1988.
Oesterreicher et al., Materials Letts. 6 (May 1988) 254.
Gross et al. (ed) Brodsky, Mat. Res. Soc. Proc., vol. 99, Nov. 1987, p. 731.
Rice et al., Appl. Phys. Letts. 51 (Nov. 1987) 1842.
Barboux et al., MRS-Proc. #99, Nov. 1987, p. 49.
Robinson et al., Ibid, #99, Nov. 1987, p. 587.
Davison et al., in High $T_c$ Superconductors, ed. Brodsky et al., MRS #99, Nov.-Dec. '87, p. 289.
Johnson et al., Adv. Cer. Mat. 2, No. 3B, Jul. 1987. p. 357
Nasu et al., in High $T_c$ Superconductors ed. Brodsky et al., MRS Symp. #99, p. 101.
Kodas et al., in High $T_c$ Superconductors II, ed. Capone II et al., Apr. 1988, MRS, p. 367.

*Primary Examiner*—Upendra Roy
*Attorney, Agent, or Firm*—Oblon, Spivak, McClelland, Maier & Neustadt

[57] ABSTRACT

A process for producing a superconductor of an oxide system, which comprises uniformly dissolving, dispersing or suspending in a solvent metal elements for constituting the oxide system at least partly in the form of carboxylates with the rest, if any, being in the form of alkoxides, acetylacetonates and/or inorganic compounds, followed by removal of the solvent to obtain a homogeneous mixture, and sintering the mixture.

12 Claims, 6 Drawing Sheets

FORMING HOMOGENEOUS PRECURSERS OF BI-SR-CA-CU VIA CARBOXYLATES IN THE PRESENCE OF OXIDIZING AGENTS

BACKGROUND OF THE INVENTION

1. FIELD OF THE INVENTION

The present invention relates to a process for producing a superconductor of an oxide system.

2. DISCUSSION OF BACKGROUND

Conventional superconductors are most commonly of a metallic type. Among them, $Nb_3Ge$ had the highest transition temperature (critical temperature) for superconductivity at a level of 23.2 K.

On the other hand, with superconductors of a metal oxide system, the critical temperature was usually lower than the superconductor of a metallic system and was at a level of 13 K even with $BaPb_{1-x}Bi_xO_3$ which had the highest critical temperature.

Recently, however, as a superconductor of an oxide system having a high critical temperature, a material of a La—Sr—Cu—O system (critical temperature: about 40 K) and a material of a Y—Ba—Cu—O system (critical temperature: about 90 K) have been discovered and have created a boom for the development of materials having high temperature superconductivity.

For the preparation of these superconductors of an oxide system, a so-called dry (powder) method and a coprecipitation method have been commonly and widely used as disclosed in Zeitschrift für Physik B-Condensed Matter, Vol. 64, p.189 (1986) and Japanese Journal of Applied Physics, Vol. 26, No. 3, PL 196 (1987) and ditto, Vol. 26, No. 4, PL 314 (1987).

The dry method is a method wherein powder materials of oxides or carbonates of e.g. La, Y, Ba, Sr and Cu are mechanically mixed by means of a mortar or a mill, followed by sintering to obtain a sintered product of oxides.

The coprecipitation method is a method wherein nitrates of the above-mentioned metals were uniformly mixed and dissolved in an aqueous medium, and then oxalic acid or ammonia is added to simultaneously form the respective precipitates in the form of a mixture.

The conventional dry method as mentioned above has drawbacks such that even when special grade reagents are used as the respective powders, their purity is not so high at a level of from 98 to 99.9% by weight, and impurities are included in the superconductor after sintering, and there is a limitation in the uniformity of the mixed state attainable by mere mechanical mixing of the respective powders and it is impossible to uniformly mix them in a strict sense, whereby unwanted phases other than the high temperature superconducting phase are likely to be present in the superconductor after sintering. Accordingly, the superconductor of an oxide system prepared by such a dry method, is obliged to have poor superconducting characteristics such that the critical temperature is low, the transition temperature range is wide, and the critical current density is small. Further, the sintering temperature is required to be high, and it takes a long time for the sintering.

In the coprecipitation method, since alkaline earth metal ions hardly precipitate unless the aqueous solution of the mixture is made alkaline, ammonia or the like is added to facilitate the precipitation of alkaline earth metal ions. However, it has a drawback that if ammonia or the like is added, copper forms complex ions, which can hardly be precipitated. Therefore, it has been pointed out that the coprecipitation method is not suitable to obtain a superconductor of an oxide system having a specific desired composition (Applied Physics, Vol. 56, No. 5, p. 606 (1987)). Thus, the coprecipitation method also has a problem in obtaining a sintered product having good superconducting characteristics.

Recently, a new high temperature oxide superconductor (constituting elements Bi—Sr—Ca—Cu—O) containing no rare earth elements has been reported at a press conference on Jan. 21, 1988 and published on Jan. 22, 1988 by Kinzoku Zairyo Gijutsu Kenkyusho, and has created a further drive for the research of new superconducting materials.

This superconductor has a superconducting phase with a critical temperature higher than the above-mentioned superconductor of a Y—Ba—Cu—O system discovered by professor Chu of Houston University and contains no rare earth elements, and it shows superconducting characteristics even when dipped in water and is stable and readily reproducible. Further, it does not contain Ba as opposed to the oxide superconductor of a YBCO system and is free from the possibility that Ba turns into $BaCO_3$ during the sintering, and it is therefore possible to set the sintering temperature at a low level. Thus, it is considered to be a practical superconductor. However, this superconductor of a Bi—Sr—Ca—Cu—O system is also produced by a dry system having the above-mentioned problem.

Further, a new superconductor of an oxide system containing thallium has been discovered by professor Hermann of Arkansas University in the United States, which has further promoted the research for new superconducting materials. This superconductor of a Tl—Ca—Ba—Cu—O system has a critical temperature higher than the superconductor of a Y—Ba—Cu—O system and can be regarded as a more practical superconducting material.

However, this superconductor was also prepared by a dry method wherein powder materials of oxides or carbonates of thallium, calcium, barium and copper were mixed by means of a mortar or a mill, followed by sintering to obtain a sintered product of oxides.

SUMMARY OF THE INVENTION

The present invention has been made to overcome the above-mentioned problems.

More specifically, it is an object of the present invention to provide a process for producing a superconductor of an oxide system having excellent superconductive characteristics such that as compared with the conventional methods, the transition temperature (critical temperature) for superconductivity is high, the transition temperature range is narrow and the critical current density (current density at the critical temperature or below) can be made high.

It is another object of the present invention to provide a process for producing an oxide superconductor of a Bi—Sr—Ca—Cu—O system having excellent superconducting characteristics, whereby the metal elements are homogeneously mixed as compared with the conventional method for the production of such a superconductor.

A further object of the present invention is to provide a process for producing a superconductor of a Tl—Ca—Ba—Cu—O system having excellent superconducting characteristics by a low temperature sintering.

The present invention provides a process for producing a superconductor of an oxide system, which comprises uniformly dissolving, dispersing or suspending in a solvent metal elements for constituting the oxide system at least partly in the form of carboxylates with the rest, if any, being in the form of alkoxides, acetylacetonates, acetylacetonate derivatives and/or inorganic compounds, followed by removal of the solvent to obtain a homogeneous mixture, and sintering the mixture.

DETAILED DESCRIPTION OF THE PREFERRED EMBODIMENTS

Figure 1:
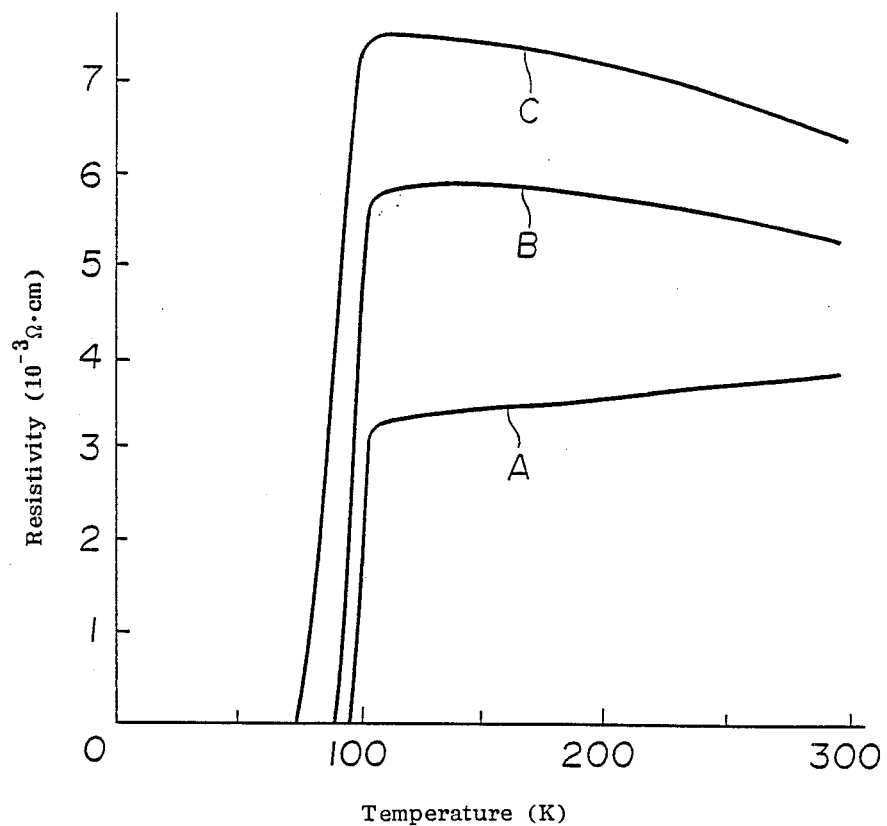
FIG. 1 is a graph showing the relation between the resistivity and the temperature of superconductors of an oxide system obtained in Example 1 (curve A) and Comparative Examples 1 and 2 (curves B and C).

In a first embodiment of the present invention, the metal elements for constituting the oxide system are at least one element selected from the group consisting of Mg, Ca, Sr and Ba of Group IIa of the Periodic Table, at least one element selected from the group consisting of Sc, Y and lanthanoides of Group IIIa of the Periodic Table, and Cu, and such metal elements are dissolved, dispersed or suspended in a solvent at least partly in the form of carboxylates with the rest, if any, being in the form of inorganic compounds. After the removal of the solvent, the homogeneous mixture is sintered to obtain the desired superconductor.

In this embodiment, the respective metal elements are mixed in the solvent in the form of the carboxylates and/or inorganic compounds, whereby it is possible to obtain a mixture wherein the respective components are homogeneously mixed in the atomic or molecular order.

The organic component (mainly the carboxylic acid residue) is removed by sintering. However, the composition of the metal elements will not thereby be changed, and the composition of the metal elements in the resulting superconductor has the same ratio of the respective metal elements in the starting material. Thus, the desired metal composition for a superconductor may optionally be selected.

There is no particular restriction as to the carboxylates of the metals (Mg, Ca, Sr, Ba, Sc, Y, lanthanoids, Cu) used in this embodiment, so long as they can be uniformly dissolved, dispersed or suspended in the solvent used. They may have any structures or forms so long as they have at least one carboxyl group bonded to a metal. Namely, the carboxylic acids to form the above-mentioned metal carboxylates may have any number of carbon atoms, may be polybasic carboxylic acids, or may contain other groups like an amino acid or oxy acid.

In the case where the metal is Cu, specific examples for such metal carboxylates include, for example, dicarboxylates of the formula $(R^1COO)_2Cu$ wherein $R^1$ is a hydrogen atom or a substituted or unsubstituted hydrocarbon group having from 1 to 50 carbon atoms, preferably the propionates, acetates, butyrates, oxalates, naphthenates, stearates and citrates. When the metal is Mg, Ca, Sr or Ba, the carboxylates include, for example, dicarboxylates of the formula $(R^2COO_2M$ wherein M is Mg, Ca, Sr or Ba, and $R^2$ is a hydrogen atom or a substituted or unsubstituted hydrocarbon group having from 1 to 50 carbon atoms, preferably the respective acetates, butanoates, naphthenates, benzoates, stearates, citrates and pentanoates. Likewise, when the metal is Sc, Y or a lanthanoid, the carboxylates include, for example, tricarboxylates of the formula $(R^3COO)M'$ wherein $M'$ is Sc, Y or a lanthanoid, and $R^3$ is a hydrogen atom and a substituted or unsubstituted hydrocarbon group having from 1 to 50 carbon atoms, preferably the cyclohexane carboxylates, acetates, butanoates, naphthenates, benzoates, citrates, stearates and octenoates. There is no particular restriction as to the inorganic compounds of metals to be used in the present invention. There may be mentioned inorganic compounds comprising, as cations, $Mg^{2+}$, $Ca^{2+}$, $Sr^{2+}$, $Ba^{2+}$, $Sc^{3+}$, $Y^{3+}$, lanthanoid ions or $Cu^{2+}$, and as anions, $CO_3^{2-}$ or $SO_4^{2-}$. Preferred specific examples of such inorganic compounds include nitrates, carbonates, hydroxides and chlorides of the metals to be used in the present invention.

There is no particular restriction as to the solvent to be used in the present invention. Any solvent may be used, so long as the carboxylates and/or the inorganic compounds of the metals to be used in the present invention can readily be dissolved, dispersed or suspended therein and it can readily be removed. Specific examples of such a solvent include distilled water, deionized water, ethyl ether, acetone, tetrahydrofuran (THF), dimethylformamide (DMF), methanol, ethanol, isopropanol, butanol, ethyl acetate, butyl acetate, toluene, xylene, methyl ethyl ketone, methyl isobutyl ketone and isoamyl alcohol. They may be used alone or in combination as a solvent mixture.

There is no particular restriction as to which metals among the metals to be used in the present invention, should be employed in the form of carboxylates or in the form of inorganic compounds. However, from the viewpoint of the efficiency in operation and in obtaining a homogeneous mixture, it is advisable to use those which are readily uniformly dissolved, dispersed or suspended as carboxylates, in the form of the carboxylates and those which are hardly dissolved, dispersed or suspended as carboxylates, in the form of the inorganic compounds. It is of course unnecessary to use the entire metals in the form of carboxylates. Namely, a part of the respective metals may be used in the form of carboxylates, and the rest may be in the form of inorganic compounds.

In this embodiment, a carboxylate and/or an inorganic compound of at least one element selected from the group consisting of Mg, Ca, Sr and Ba (hereinafter referred to as a Group IIa compound), a carboxylate and/or an inorganic compound of at least one element selected from the group consisting of Sc, Y and lanthanoids (hereinafter referred to as a Group IIIa compound) and a carboxylate and/or an inorganic compound of Cu (hereinafter referred to as Cu compound) are dissolved, dispersed or suspended in a solvent, and then the solvent is removed. By this mixing operation, the carboxylates and/or the inorganic compounds used, are uniformly mixed in the solvent in the atomic or molecular order.

In this specification, the term "uniformly mixed" is a concept which covers not only the uniformity like a solution but also a substantially uniform state like an emulsion or a dispersion.

There is no particular restriction as to the proportions for mixing the Group IIa compound, the Group IIIa compound and the Cu compound. They may be mixed in any proportions so long as the desired superconductor of an oxide system can be obtained. However, when Y is used as the Group IIIa element, the ratio of the Group IIa compound/the $\gamma$-containing compound/the Cu compound is preferably 2-10/$\frac{1}{3}$-10 (atomic ratio of metals). When La is used as the Group IIIa element, the ratio of (the Group IIa compound+the La-containing compound)/the Cu compound is preferably about 2/1 (atomic ratio of metals). There is no particular restriction as to the ratio between the Group IIa compound and the La containing compound.

Further, there is no particular restriction as to the ratio between the carboxylates and/or the inorganic compounds of the metals and the solvent. The amount of the solvent may be such that the carboxylates and/or the inorganic compounds are immersed in the solvent. However, with a view to readily removing the solvent and uniformly mixing the carboxylates and/or the inorganic compounds, it is preferred to use the solvent in an amount of about ten times the total weight of the carboxylates and/or the inorganic compounds.

The solvent may be removed by a method such as concentration under atmospheric pressure or concentration under reduced pressure. However, concentration under reduced pressure is preferred to obtain a homogeneous mixture after the removal of the solvent.

The homogeneous mixture thus obtained is then sintered to obtain a superconductor of an oxide system.

There is no particular restriction as to the sintering conditions (the temperature, the number of times, the atmosphere, etc.). If necessary, presintering may be conducted at a temperature of from 300° to 500° C. for from 30 to 60 minutes, and then the sintering is usually conducted at a temperature cf from 800° to 1,000° C., preferably from 900° to 950° C., for at least 2 hours, preferably at least 4 hours. Otherwise, prior to the sintering, the obtained mixture may be calcined at a temperature of from 800° to 1,000° C., preferably from 900° to 950° C. for at least 2 hours, preferably at least 4 hours, then pulverized and molded, and the molded product is sintered at a temperature of from 850° to 1,000° C., preferably from 900° to 950° C. for at least 2 hours, preferably at least 4 hours.

There is no particular restriction as to the pressure for molding. However, the pressure is preferably high and is usually preferably at least 0.5 kg/cm$^2$G.

The atmosphere during the sintering may be an oxygen atmosphere or air. In order to obtain a product having good superconducting characteristics, it is preferred to employ an atmosphere rich in oxygen.

There is no particular restriction as to the cooling conditions after the sintering. The sintered products may be naturally cooled in air unless cracking does not occur, or may be cooled in an oxygen stream over a period of 10 hours.

In a second embodiment of the present invention, the same metal elements as in the first embodiment are dissolved, dispersed or suspended in a solvent wholly in the form of carboxylates in the presence of an oxidizing agent, and the homogeneous mixture obtained by the removal of the solvent is sintered in an oxygen atmosphere.

In this embodiment, the carboxylates of the respective metals are uniformly dissolved, dispersed or suspended in a solvent, and then the solvent is removed to obtain a mixture. Therefore, it is thereby possible to obtain a mixture wherein the respective components are homogeneously mixed.

Further, since the mixture is prepared in the presence of an oxidizing agent, the decomposition of the carboxylates is facilitated, and the conversion to metal oxides will be facilitated.

Further, when the sintered product is further subjected to oxygen gas plasma treatment, the critical temperature can be made higher, and the superconducting characteristics will be stabilized so that the change with time of the superconductive characteristics will be small.

The metal carboxylates and the solvent used in this embodiment may be the same as described with respect to the first embodiment.

The oxidizing agent which may be used in this embodiment includes, for example, peroxides (compounds having a —O—O— bond in their molecules) such as $H_2O_2$, benzoyl peroxide, peracetic acid, perbenzoic acid and m-chloroperbenzoic acid, and ozone.

In this embodiment, a carboxylate of at least one element selected from the group consisting of Mg, Ca, Sr and Ba (hereinafter referred to as a IIa compound), a carboxylate of at least one element selected from the group consisting of Sc, Y and lanthanoids (hereinafter referred to as a Group IIIa compound) and a carboxylate of Cu are uniformly mixed in the presence of an oxidizing agent, and then the solvent is removed.

The presence of an oxidizing agent simply means that the oxidizing agent is present at the time when the carboxylates have been uniformly dissolved, dispersed or suspended. The oxidizing agent is preferably uniformly present in the liquid, but may not necessarily be so. For example, in the case of ozone, it may be introduced by bubbling.

The mixing ratio of the Group IIa compound, the Group IIIa compound and the Cu carboxylate is not critical, and may be the same as described with respect to the first embodiment.

There is no particular restriction as to the ratio between the metal carboxylates and the solvent. However, the solvent is preferably used in an amount of about 10 times the total amount of the carboxylates, since the carboxylates can thereby be uniformly mixed.

Likewise, the oxidizing agent may be used in an optional amount without any particular restriction so long as the carboxylates can uniformly be mixed. However, when the oxidizing agent is benzoyl peroxide dissolved in a solvent, it is preferably within a range of from 0.01 to 10 molecules per metal atom. Likewise, in the case of ozone, it is preferred to introduce it in exceeds or in large excess to the reactor.

The removal of the solvent may be conducted by a method such as concentration under atmospheric pressure or concentration under reduced pressure. It is preferred to employ concentration under reduced pressure in order to obtain a homogeneous mixture after the removal of the solvent. Further, it is preferred to remove the solvent under heating to facilitate the action of the oxidizing agent.

The mixture thus obtained may be subjected to presintering or calcination in an oxygen atmosphere. In such a case, the presintering may be conducted at a temperature of from about 300° to 500° C. for about 30 to 60 minutes, and/or calcination may be conducted at a temperature of from about 800° to 1,000° C., preferably from 900° to 950° C. for about 4 to 10 hours. The calcined mixture may be pulverized and molded, and then subjected to sintering at a temperature of from about 850° to 1,000° C., preferably from 900° to 950° C. for about 4 to 10 hours to obtain a superconductor of an oxide system. It is of course possible to conduct sintering directly without the presintering or calcination.

The term "in the oxygen atmosphere" means the state where oxygen is sufficiently present, and the oxygen content of at least 50% is preferred.

The superconductor of an oxide system produced by the method of this embodiment has excellent superconducting characteristics as is different from the product obtained by the conventional dry method using mere mechanical mixing. The superconducting characteristics will be further improved by subjecting this superconductor to oxygen gas plasma treatment. The apparatus used for the oxygen gas plasma treatment may be any apparatus so long as so-called plasma state is produced. As such an apparatus, for example, a plasma deposition apparatus, a plasma CVD apparatus or a plasma etching apparatus may be mentioned. Among them, a high frequency plasma deposition apparatus is preferred from such viewpoints that it is relatively inexpensive, and the sample will not be etched.

As the conditions for the plasma treatment, it is preferred that in the case of a high frequency plasma deposition apparatus, the oxygen gas pressure is about 1 mb, the power is from about 30 to 100 W and the treating time (discharge hour) is from 0.5 to 3 hours. If the power and the treating time are less than these values, it tends to be difficult to obtain a superconductor of an oxide type having good superconducting characteristics. On the other hand, if they exceed the above ranges, no adequate effects to compensate the consumed energy or time will be obtained.

In a third embodiment of the present invention, the metal elements for constituting the oxide system are Bi, Sr, Ca and Cu, and they are dissolved, dispersed or suspended in a solvent at least partly in the form of carboxylates with the rest, if any, being in the form of alkoxides and/or acetylacetonates, followed by removal of the solvent to obtain a homogeneous mixture, which is then sintered to obtain a superconductor of a Bi—Sr—Ca—Cu—O system. The uniformly dissolved, dispersed or suspended mixture may be hydrolyzed prior to the removal of the solvent.

The metal alkoxides and the metal acetylacetonates to be used in this embodiment can be prepared usually in a high purity of from 99.999 to 99.99999%. By using such pure materials and by uniformly mixing then in a solvent, it is possible to obtain a homogeneous superconductor having a high purity.

The alkoxides of Bi, Sr, Ca and Cu to be used in this embodiment may be of any structures or forms. Namely, the alkoxy group for such a metal alkoxide may have any number of carbon atoms and may be an alkoxy group from a polyhydric alcohol. Preferred specific examples of such an alkoxy group includes, for example, a methoxy group, an ethoxy group, a propoxy group, an isopropoxy group, a butoxy group, a t-butoxy group, a sec-butoxy group and ethylene glycol. However, the alkoxy group is not limited to such specific examples. Further, there is no particular restriction to the number of alkoxy groups bonded to a metal element, and at least one alkoxy group may be bonded to a metal element.

The acetylacetonates of Bi, Sr, Ca and Cu to be used in this embodiment are compounds wherein at least one acetylacetonate group is attached to such a metal atom. They may be of any structures or forms. Namely, so long as the basic structure is acetylacetonate, for example, the hydrogen atom may be substituted by a fluorine atom or a hydrocarbon group. The carboxylates of Bi, Sr, Ca and Cu to be used in the present invention may be of any structures or forms. Namely, the carboxylic acid constituting such a carboxylate may have any number of carbon atoms. Specific examples of such a carboxylic acid include, for example, acetic acid, butyric acid, stearic acid, oleic acid, valeric acid, propionic acid, benzoic acid, isobutyric acid and acrylic acid. However, the carboxylic acid is not limited to such specific examples. Further, there is no particular restriction to the number of carboxylic acid residues bonded to a metal atom, and at least one residue may be bonded to a metal element.

A part or some of Bi, Sr, Ca and Cu may be used in the form of the respective metal alkoxide or in the form of the respective acetylacetonates. Further, one metal may be used in the form of two types of metal compounds as in the case where a Bi alkoxide and a Bi acetylacetonate are used as the Bi component.

There is no particular restriction as to the ratio of Bi, Sr, Ca and Cu. They may be used in any ratio so long as the desired superconductor of an oxide system can be obtained. However, it is preferred to use them in a compositional ratio to form a high Tc phase (Tc=about 120 K (on set)). Usually, a compositional ratio of $Bi_1Sr_{0.5-3}Ca_{0.5-3}Cu_{0.5-3.5}$ is preferred.

In this embodiment, the metal carboxylates are uniformly dissolved, dispersed or suspended, optionally together with the above-mentioned metal alkoxides or metal acetylacetonates, in a solvent such as methyl alcohol, ethyl alcohol, isopropyl alcohol, butyl alcohol, benzene, toluene, xylene, tetrahydrofuran, diethyl ether, diphenylether or DMF. Then, the solvent is removed directly or after the hydrolysis, and the resulting homogeneous mixture is sintered.

There is no particular restriction as to the concentration of the metal alkoxides, the metal acetylacetonates or the metal carboxylates in the above solvent, so long as such metal compounds can be uniformly dissolved, dispersed or suspended in the solvent.

When at least one of Ba, Sr, Ca and Cu is used in the form of a metal alkoxide or a metal acetylacetonate, and such a metal alkoxide or a metal acetylacetonate dissolved, dispersed or suspended in the solvent is subjected to hydrolysis, it undergoes a change from a sol to a gel and finally forms the metal hydrate (hydroxide) or metal oxide particles. This method is a so-called sol-gel method and has features such that it is thereby possible to obtain super fine particles of the metal hydrate (hydroxide) or oxide and that it is thereby possible to obtain a homogeneous mixture of two or more metal hydrates (hydroxides) or oxides. Further, it is thereby possible to set the sintering temperature at a level lower than the dry method and the sintering time at a level shorter than the dry method.

When the metal carboxylates are used in combination, such metal carboxylates (metal ions) are uniformly taken in the above-mentioned sol, whereby a homogeneous mixture of metal compounds is obtainable. Such metal carboxylates can readily be thermally decomposed by heat treatment to form the corresponding oxides or carbonates.

By using highly pure metal alkoxides or metal acetylacetonates as mentioned above and highly pure water (such as deionized water or distilled water), it is possible to obtain particles (powder) of the metal hydrate (hydroxide) or oxide having a purity substantially higher than that attainable by the dry method.

The resulting sol and gel are usually amorphous as analyzed by X-ray analysis. However, it has been confirmed by experiments that they will be all readily converted to the corresponding metal oxides by sintering.

There is no particular restriction as to the concentration of the metal alkoxides, the metal acetylacetonates or the metal carboxylates during the hydrolysis, the manner of addition of water or the conditions for the hydrolysis. The amount of water added for the hydrolysis may be at any level in excess of the stoichiometric amount for the hydrolysis of the metal alkoxides or the metal acetylacetonates, but is preferably in large excess. The reaction temperature is preferably at a level of the boiling point of the solvent, and the reaction time is preferably from 5 to 15 hours.

For the hydrolysis, an acid or a base, such as methoxy ethanol, ethanolamine, n-methyl ethanolamine, triethylamine, HCl, $HNO_3$ or $H_2SO_4$, may be added in a small amount, preferably in an amount of from 0.1 to 10 times the molar amount of the total of the starting materials to regulate the rate of the hydrolysis, to facilitate the sol-gel transformation or to increase the solubility prior to the hydrolysis.

The resulting hydrolyzates may be composed solely of metal oxides, but they may usually be amorphous hydrates (inclusive of hydroxides) in many cases, which can readily be converted to metal oxides by sintering at a relatively low temperature (200°–500° C.).

There is no particular restriction as to the manner of removing the solvent. The solvent may be removed by evaporation or filtration followed by drying.

There is no particular restriction as to the sintering conditions (such as the temperature, the number of times and the atmosphere). However, it is usual to employ a temperature of from 700° to 950° C., preferably from 800° to 900° C. and a time of from 1 to 20 hours, preferably from 1 to 8 hours, whereby the sintering can be conducted at a low temperature for a short period of time as compared with the conventional dry method.

In a fourth embodiment of the present invention, the metal elements for constituting the oxide system are Tl, Ca, Ba and Cu, and they are dissolved, dispersed or suspended in a solvent at least partly in the form of carboxylates with the rest, if any, being in the form of alkoxides and/or acetylacetonates, followed by removal of the solvent to obtain a homogeneous mixture, which is then sintered to obtain a superconductor of a Tl—Ca—Ba—Cu—O system. The uniformly dissolved, dispersed or suspended mixture may be hydrolyzed prior to the removal of the solvent.

The alkoxides and the acetylacetonates of the metal elements to be used in this embodiment are uniformly dissolved, dispersed or suspended in a solvent and then hydrolyzed by an addition of water, whereby they undergo a change from a sol to a gel and finally form particles of the metal hydrates (hydroxides) or oxides. This method is a so-called sol-gel method, which has been described in the foregoing.

As mentioned above, the metal alkoxides and the metal acetylacetonates may usually be obtained in a high purity at a level of from 99.999 to 99.99999%. Therefore, by using such high purity metal compounds and highly pure water (such as deionized water or distilled water), it is possible to obtain particles (powder) of metal hydrates (hydroxides) or oxides having a purity substantially higher than that attainable by the conventional dry method. Further, since uniformly mixed super fine particles are obtainable, there is a merit such that the sintering temperature can be made low and the reaction time can be made short as compared with the dry method.

On the other hand, the carboxylates can readily be thermally decomposed to the oxides by heat treatment and uniformly taken in the sol formed by the alkoxides or the acetylacetonates.

The sol and the gel obtained by this method are usually amorphous as analyzed by the X-ray analysis, and it has been confirmed by experiments that they will be all converted to the metal oxides by sintering.

The alkoxides, the acetylacetonates and the carboxylates of thallium, calcium, barium and copper used in this embodiment may be of any structures or forms. Namely, the alkoxy group constituting such a metal alkoxide may have any number of carbon atoms, and may be an alkoxy group from a polyhydric alcohol. Preferred specific examples of such an alkoxy group include a methoxy group, an ethoxy group, a propoxy group, an isopropoxy group, a butoxy group, a t-butoxy group, a sec-butoxy group and ethylene glycol. However, the alkoxy group is not limited to such specific examples.

Whereas, the acetylacetonates may be of any structures or forms so long as the basic structure is acetylacetonate. Namely, the hydrogen atom of the basic structure may be substituted by e.g. a halogen atom or an oxygen functional group. And they may have any number of carbon atoms.

Likewise, the carboxylates may be of any structures or forms, and may be polybasic carboxylates.

Further, there is no particular restriction as to the number of alkoxy groups, acetylacetonate groups or carboxyl groups bonded to a metal element. At least one such group may be bonded to a metal element.

The solvent useful in this embodiment includes, for example, methyl alcohol, ethyl alcohol, isopropyl alcohol, butanol, benzene, toluene, xylene, tetrahydrofuran, diethyl ether, diphenyl ether, DMF, a primary amine, a secondary amine and a tertiary amine.

Now, the present invention will be described in further detail with reference to Examples. However, it should be understood that the present invention is by no means restricted to such specific Examples.

EXAMPLE 1 and COMPARATIVE EXAMPLES 1 and 2

So as to bring the composition of the desired superconductor of an oxide system to $YBa_2Cu_3O_7$, barium acetate, yttrium stearate and copper chloride were added in a predetermined ratio in a total amount of 10 g in 200 ml of diacetone alcohol, and uniformly dispersed (partially dissolved), and the dispersion was heated at 60° C. for one hour to remove the solvent and obtain a mixture.

The mixture thus obtained was presintered in air at 900° C. for 3 hours to obtain a presintered porous product. This product was pulverized in a mortar and formed into a pellet having a diameter of 10 mm and a thickness of 1.5 mm by means of a pelletizer. The pellet was again sintered in an oxygen stream at 960° C. for 6 hours to obtain a densely sintered product.

For the purpose of comparison, a mixture of $Y_2O_3$, $BaCO_3$ and $CuO$ powders and a precipitate formed by the addition of small amounts of ammonia and oxalic acid to an aqueous solution of nitrates of Y, Ba and Cu, each prepared by guaranteed reagents, were, respectively, presintered and sintered in the same manner as above to obtain sintered products according to the conventional dry method and the coprecipitation method (Comparative Examples 1 and 2).

With respect to three types of samples, the temperature dependency of the resistivity was measured by a four terminal method by placing each sample provided with four indium electrodes with a space of 1.5 mm from one another in a criostat and gradually cooling it with liquefied helium. The results are shown in FIG. 1. In FIG. 1, curve A shows the characteristics of the sample obtained by the process of the present invention, curve B shows the characteristics of the sample obtained by the conventional dry method, and the curve C shows the characteristics of the sample obtained by the conventional coprecipitation method.

As is evident from FIG. 1, the superconductor of an oxide system according to the present invention shows a sharp decrease of the resistivity to 0 i.e. an abrupt transition to the superconductive state when cooled, as compared with the products according to the conventional methods. The onset temperature at which the resistivity of each sample has started to sharply decrease to the superconductive state, the offset temperature at which the resistivity has reached 0 and the difference between the two temperatures (transition temperature range) are shown in Table 1. Further, at the liquefied nitrogen temperature (77.4 K), the applied temperature to each sample was gradually raised to increase the current, and the critical current density at which the superconducting state was broken and turned to the normal conducting state, was determined and shown in Table 1.

TABLE 1

| Example No. | Method for the preparation of the sample | Onset temp. (K) | Offset temp. (K) | Transition temperature range (K) | Critical current density (A/cm$^2$) |
|---|---|---|---|---|---|
| Example 1 | Process of the Present invention | 100.5 | 96.0 | 4.5 | 168.1 |
| Comparative Example 1 | Dry method | 100.4 | 87.5 | 12.9 | 39.6 |
| Comparative Example 2 | Coprecipitation method | 100.2 | 78.0 | 22.2 | 8.7 |

From the results of Table 1, it is evident that as compared with the products prepared by the conventional methods, the superconductor of an oxide type prepared by the process of the present invention not only has a high temperature at which the resistivity becomes completely 0, but also has practically very advantageous characteristics that the transition temperature range from the normal conducting state to the superconducting state is narrow and the critical current density is very high. Whereas, with the products obtained by the conventional methods, particularly by the coprecipitation method, all of the offset temperature, the transition temperature range and the critical current density are inadequate for practical application.

With respect to the above three types of the sintered product samples, the structural analysis was conducted by X-ray diffraction, whereby it was found that the product prepared by the process of the present invention was a sintered product having a substantially uniform single phase of so-called oxygen-deficient three-layer type perovskite. Whereas, the products by the conventional dry method and the coprecipitation method have relatively many phases in addition to the high temperature superconductive phase. Especially the product by the coprecipitation method was found to have a composition which was substantially deviated from the desired composition of elements. The poor characteristics of the superconductors of an oxide system according to the conventional methods as shown in FIG. 1 and Table 1, are considered to be attributable to e.g. such a compositional deviation.

EXAMPLE 2 and COMPARATIVE EXAMPLES 3 and 4

So as to bring the composition of the desired superconductor of an oxide system to $(La_{0.9}Sr_{0.1})_2CuO_4$, lanthanum pentanoate, strontium nitrate and copper maleate were added in a total amount of 15 g in 300 ml of tetrahydrofuran and uniformly dispersed (partially dissolved), and the dispersion was heated at 80° C. for 2 hours to remove the solvent and obtain a mixture. The mixture thus obtained was preliminarily calcined in a oxygen stream at 400° C. for 3 hours and ten presintered in an oxygen stream at 900° C. for 8 hours to obtain a coarse presintered product. The presintered product was pulverized and then formed into a pelletized sample in the same manner as in Example 1. This pellet was sintered in an oxygen stream at 910° C. for 8 hours to obtain a densely sintered product.

For the purpose of comparison, samples by the conventional dry method and the coprecipitation method were, respectively, prepared in the same manner as in Example 1 by using $La_2O_3$, $SrCO_3$ and $CuO$ powders and nitrates of La, Sr and Cu, respectively, and presintered and sintered in the same manner as above to obtain two types of sintered products (Comparative Examples 3 and 4).

With respect to the three types of samples thus obtained, the temperature dependency of the resistivity and the critical current density were measured in the same manner as in Example 1. The results are shown in FIG. 2 and Table 2.

Figure 2:
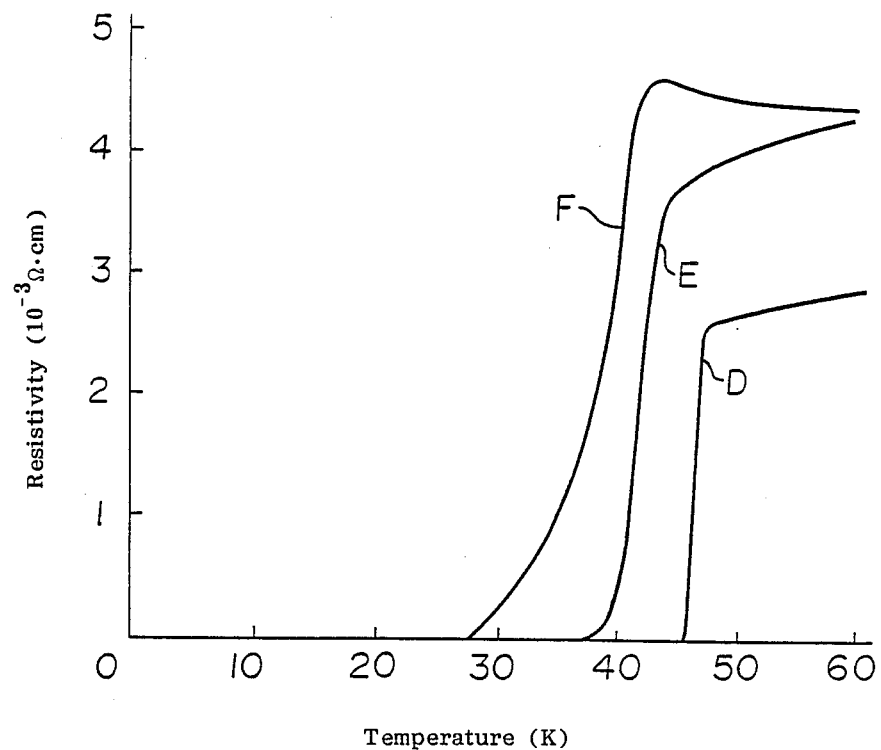
FIG. 2 is a graph showing the relation between the resistivity and the temperature of superconductors of an oxide system obtained in Example 2 (curve D) and Comparative Examples 3 and 4 (curves E and F).

In FIG. 2, curve D shows the characteristics of the product prepared by the process of the present invention, curve E shows the characteristic of the product prepared by the conventional dry method, and curve F shows the characteristics of the product prepared by the conventional coprecipitation method. The critical current density is the value in the superconducting state (4.3 K).

TABLE 2

| Example No. | Method for the preparation of the sample | Onset temp. (K) | Offset temp. (K) | Transition temperature range (K) | Critical current density (A/cm$^2$) |
|---|---|---|---|---|---|
| Example 2 | Process of the Present invention | 46.8 | 45.7 | 1.1 | 196.3 |
| Comparative Example 3 | Dry method | 43.8 | 36.9 | 6.9 | 25.3 |
| Comparative Example 4 | Coprecipitation method | 42.5 | 27.2 | 15.3 | 17.4 |

From the results in FIG. 2 and in Table 2, it is evident that as compared with the product by the conventional methods, the superconductor of an oxide system prepared by the process of the present invention has practically excellent superconducting characteristics such that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. From the results of the analysis by X-ray diffraction conducted in the same manner as in Example 1, the poor characteristics of the superconductors of an oxide system prepared by the conventional methods, are considered to be attributable to the presence of relatively many unwanted phases in addition to the high temperature superconductive phase.

With respect to each of the samples used in Examples 1 and 2, the susceptibility was measured, whereby in each case, Meissner effects were observed at a temperature not higher than the temperature at which the resistance became 0.

EXAMPLE 3 and COMPARATIVE EXAMPLES 5 and 6

So as to bring the composition of the desired superconductor of an oxide system to $YBa_2Cu_3O_7$, yttrium acetate, barium butanoate and copper borate were added in a predetermined ratio in a total amount of 50 g in 1 liter of a solvent mixture of distilled water/ethanol with a volume ratio of 1/1. Further, 20 g of an aqueous hydrogen peroxide solution was gradually added thereto, and the mixture was uniformly dispersed (partially dissolved) and then concentrated under reduced pressure to obtain a dried mixture.

The dried mixture was presintered in an oxygen stream at 910° C. for 3 hours to obtain a porous presintered product. This product was pulverized in a mortar and formed into a pellet having a diameter of 10 mm and a thickness of 1.5 mm. This pellet was again sintered in an oxygen stream at 920° C. for 7 hours to obtain a densely sintered product.

The superconductor of an oxide system thus obtained was set in a reactor of a high frequency plasma deposition apparatus. After adjusting the pressure to a level of $10^{-3}$ Torr, plasma treatment was conducted wile supplying oxygen gas. The bell jar was made of quart; glass, the oxygen gas pressure was 1 mb (0.75 Torr), the RF power was 50 W, the substrate temperature was 400° C., and the treating time (discharge time) was one hour.

For the purpose of comparison, a mixture of $Y_2O_3$, $BaCO_3$ and CuO powders and a precipitate formed by the addition of small amounts of ammonia and oxalic acid to an aqueous solution of nitrates of Y, Ba and Cu, each prepared by guaranteed reagents, were, respectively, presintered and sintered in the same manner a above to obtain sintered products according to the conventional dry method and the coprecipitation method.

With respect to the three types of samples, the temperature dependency of the resistivity was measured by a four terminal method by placing each sample provided with four indium electrodes with a space of 1.5 mm from one another in a criostat and gradually cooling it with liquefied helium. The results are shown in FIG. 3.

Figure 3:
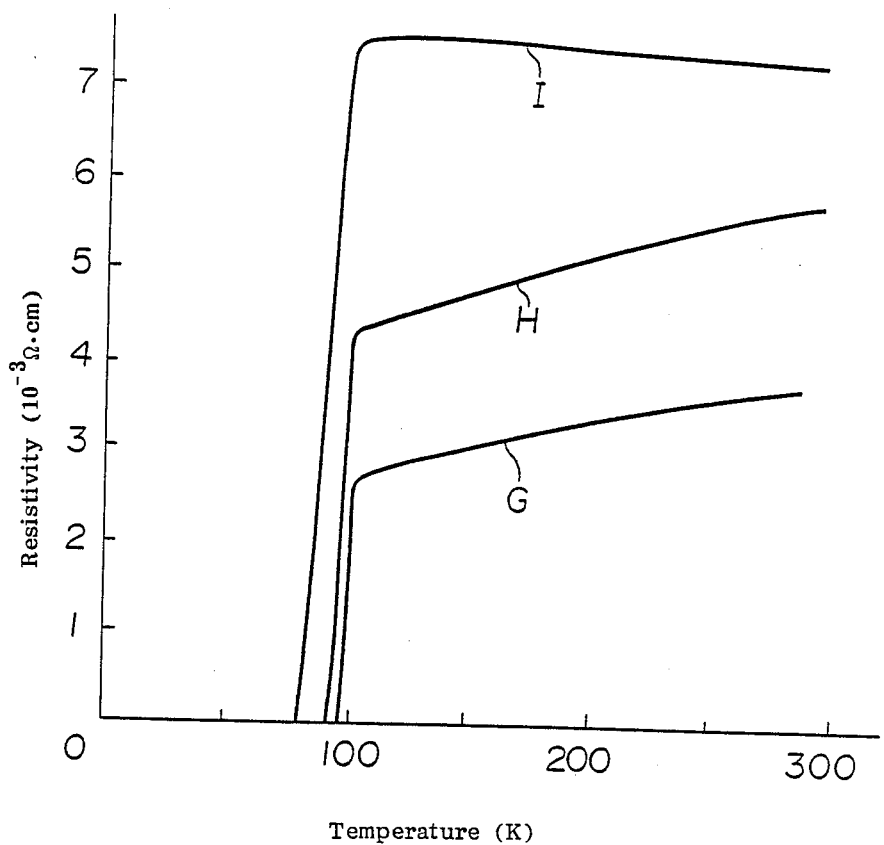
FIG. 3 is a graph showing the relation between the resistivity and the temperature of superconductors of an oxide system obtained in Example 3 (curve G) and Comparative Examples 5 and 6 (curves H and I).

In FIG. 3, curve G shows the characteristics of the sample prepared by the process of the present invention, curve H shows the characteristics of the sample prepared by the conventional dry method, and curve I shows the characteristics of the sample prepared by the conventional coprecipitation method.

From FIG. 3, it is evident that as compared with the products by the conventional methods, the superconductor of an oxide system prepared by the process of the present invention undergoes an abrupt drop of the resistivity to 0 i.e. the transition to the superconducting state when cooled. The onset temperature, the offset temperature and the transition temperature range of each sample are shown in Table 3. Further, the critical current density at the liquefied nitrogen temperature (77.4 K) was obtained and shown in Table 3.

Further, samples were prepared in air and in nitrogen instead of in oxygen as the atmosphere for sintering, and their characteristics were examined, whereby the product sintered in nitrogen showed no superconductivity and was an insulating material. On the other hand, the amount of the oxygen taken in was inadequate with the sample sintered in air, and it did not show superconductivity at a temperature of the liquefied nitrogen (77.4 K) or higher.

TABLE 3

| Example No. | Method for the preparation of the sample | Onset temp. (K) | Offset temp. (K) | Transition temperature range (K) | Critical current density (A/cm$^2$) |
| --- | --- | --- | --- | --- | --- |
| Example 3 | Process of the Present invention | 98.9 | 97.6 | 1.3 | 102.6 |
| Comparative Example 5 | Dry method | 97.3 | 87.2 | 10.1 | 32.1 |
| Comparative Example 6 | Coprecipitation method | 95.3 | 79.9 | 15.4 | 28.6 |

From the results of Table 3, it is evident that as compared with the products prepared by the conventional methods, the superconductor of an oxide type prepared by the process of the present invention not only has a high temperature at which the resistivity becomes completely 0, but also has practically very advantageous characteristics that the transition temperature range from the normal conducting state to the superconducting state is narrow and the critical current density is very high. Whereas, with the products obtained by the conventional methods, particularly by the coprecipitation method, all of the offset temperature, the transition temperature range and the critical current density are inadequate for practical application.

With respect to the above three types of the sintered product samples, the structural analysis was conducted by X-ray diffraction, whereby it was found that the product prepared by the process of the present invention was a sintered product having a substantially uniform single phase of so-called oxygen-deficient three-layer type perovskite. Whereas, the products by the conventional dry method and the coprecipitation method have relatively many phases in addition to the high temperature superconductive phase. Especially the product by the coprecipitation method was found to have a composition which was substantially deviated from the desired composition of elements. The poor characteristics of the superconductors of an oxide system according to the conventional methods as shown in FIG. 3 and Table 3, are considered to be attributable to e.g. such a compositional deviation.

EXAMPLES 4 and COMPARATIVE EXAMPLES 7 and 8

So as to bring the composition of the desired superconductor of an oxide system to $(La_{0.9}Sr_{0.1})_2CuO_4$, lanthanum acetate, strontium butanoate and copper butyrate were added in a total amount of 40 g to 500 ml of ethanol at 80° C. Further, 10 g of an aqueous hydrogen peroxide solution was gradually added, and the mixture was uniformly dispersed (partially dissolved) and then heated to remove the solvent and obtain a dried mixture.

The dried mixture was preliminarily calcined at 50° C. for 2 hours and then presintered in an oxygen stream at 930° C. for 5 hours to obtain a coarse presintered product. The presintered product was pulverized and formed into a pelletized sample in the same manner as in Example 3. This pellet was sintered in an oxygen stream at 900° C. for 8 hours in the same manner as in Example 3 to obtain a densely sintered product.

For the purpose of comparison, samples by the conventional dry method and the coprecipitation method were prepared in the same manner as in Example 3 by using $La_2O_3$, $SrCO_3$ and $CuO$ powders and nitrates of La, Sr and Cu, respectively, and presintered and sintered in the same manner as above to obtain two types of sintered products.

With respect to the three types of samples thus obtained, the temperature dependency of the resistivity and the critical current density were measured in the same manner as in Example 3. The results are shown in FIG. 4 and Table 4.

Figure 4:
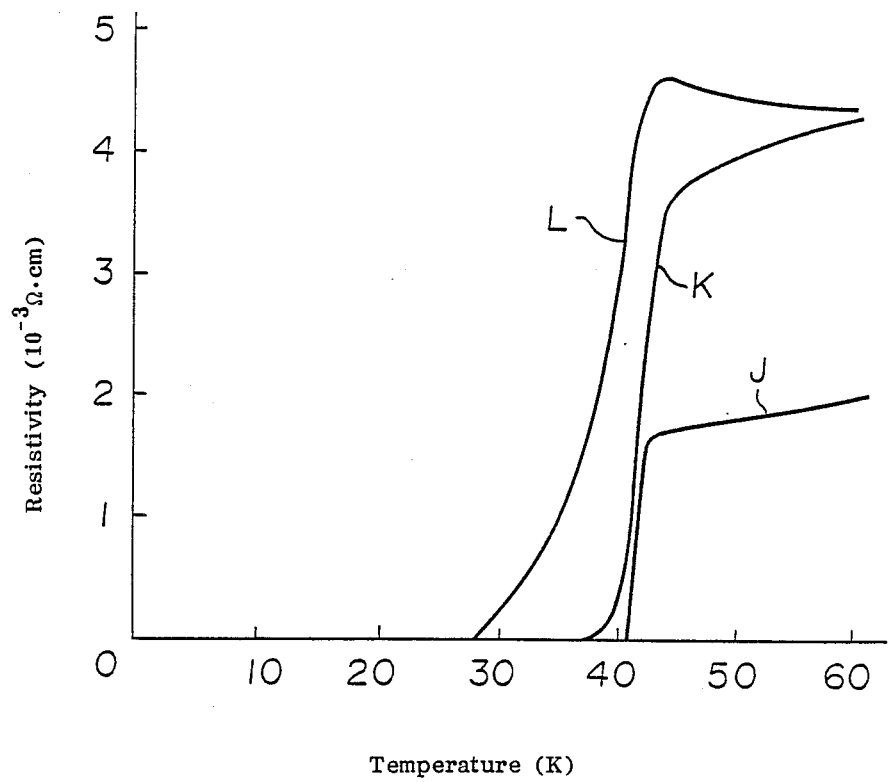
FIG. 4 is a graph showing the relation between the resistivity and the temperature of superconductors of an oxide system obtained in Example 4 (curve J) and Comparative Examples 7 and 8 (curves K and L).

In FIG. 4, curve J shows the characteristics of the sample prepared by the process of the present invention, curve K shows the characteristics of the sample prepared by the conventional dry method, and curve L shows the characteristics of the sample prepared by the conventional coprecipitation method. The critical current density was the value in the superconducting state (4.3 K).

TABLE 4

| Example No. | Method for the preparation of the sample | Onset temp. (K) | Offset temp. (K) | Transition temperature range (K) | Critical current density (A/cm$^2$) |
| --- | --- | --- | --- | --- | --- |
| Example 4 | Process of the Present invention | 44.2 | 40.9 | 3.3 | 97.2 |
| Comparative Example 7 | Dry method | 42.9 | 38.6 | 4.3 | 36.1 |
| Comparative Example 8 | Coprecipitation method | 40.1 | 27.5 | 12.6 | 19.2 |

From the results in FIG. 4 and in Table 4, it is evident that as compared with the product by the conventional methods, the superconductor of an oxide system prepared by the process of the present invention has practically excellent superconducting characteristics such that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. From the results of the analysis by X-ray diffraction conducted in the same manner as in Example 3, the poor characteristics of the superconductors of an oxide system prepared by the conventional methods, are considered to be attributable to the presence of relatively many unwanted phases in addition to the high temperature superconductive phase and to oxygen deficiency.

With respect to each of the samples used in Examples 3 and 4, the susceptibility was measured, whereby in each case, Meissner effects were observed at a temperature not higher than the temperature at which the resistance became 0.

EXAMPLE 5 and COMPARATIVE EXAMPLE 9

So as to bring the composition of the desired Bi—Sr—Ca—Cu—O superconductor to $Bi_1Sr_1Ca_1Cu_2O_x$, $Bi(OC_2H_5)_3$, $Sr(CH_3COO)_2$, $Ca(CH_3CH_2COO)_2$ and $Cu(OC_2H_5)_2$ (each having a purity of 99.999% except for $Sr(CH_3COO)_2$ which had a purity of 99.9%) were added in a predetermined ratio in a total amount of 5 g in 500 ml of ethanol. Further, 0.1 ml of N-methylethanolamine was aided thereto. Then, the mixture was refluxed for 24 hours in a nitrogen atmoshere, and 5 ml of water was added thereto over a period of 30 minutes. The mixture was further refluxed for 24 hours to obtain black particles.

The product thus obtained was analyzed by an X-ray diffraction apparatus and found to be an amorphous mixture of Bi, Sr, Ca and Cu.

The product was concentrated under reduced pressure to remove the solvent, dried at 300° C. for 1 hour and then formed into a pellet having a diameter of 10 mm and a thickness of 1.5 mm by a pelletizer. This pellet was sintered in an oxygen stream at 900° C. for 8 hours to obtain a densely sintered product.

For the purpose of the comparison, a mixture of $Bi_2O_3$, $SrCO_3$, $CaO$ and $CuO$ powders which were all guaranteed reagents, was sintered in the same manner as above to obtain a sintered product according to the conventional dry method.

With respect to the two types of samples, the temperature dependency of the resistivity was measured by a four terminal method by placing each sample provided with four indium electrodes with a space of 1.5 mm from one another in a criostat and gradually cooling it. The results are shown in Table 5 and FIG. 5.

Figure 5:
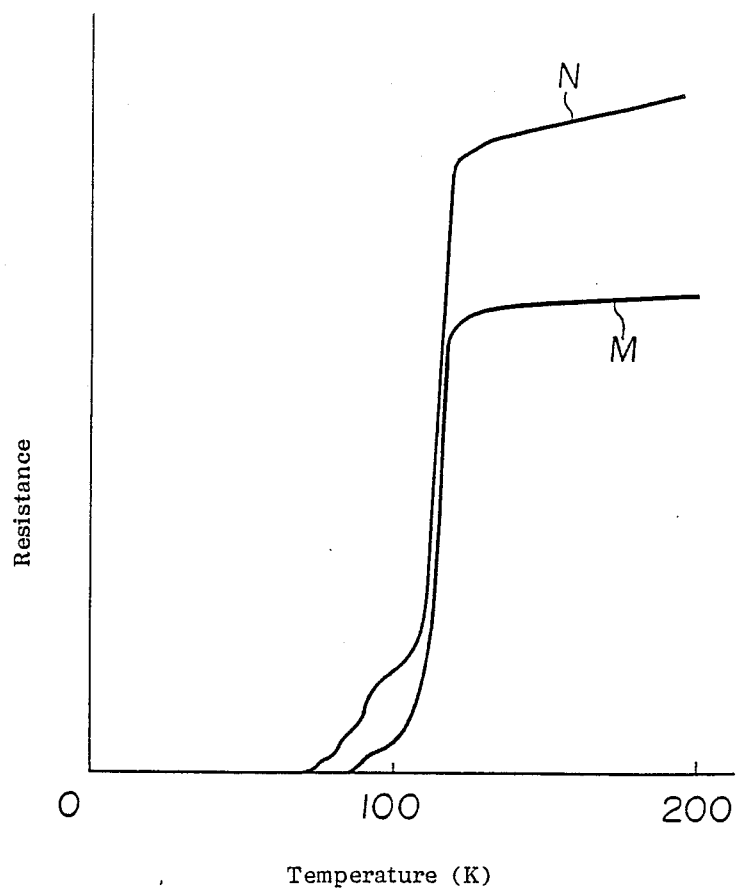
FIG. 5 is a graph showing the relation between the resistivity and the temperature of superconductors of a Bi—Sr—Ca—Cu—O system obtained in Example 5 (curve M) and Comparative Example 9 (curve N).

In FIG. 5, curve M shows the characteristics of the sample prepared by the process of the present invention, and curve N shows the characteristics of the sample prepared by the conventional dry method.

TABLE 5

| Example No. | Onset (K) | Offset (K) |
|---|---|---|
| Example 5 | 124 | 84 |
| Comparative Example 9 | 120 | 70 |

From the results of Table 5 and FIG. 5, it is evident that as compared with the products prepared by the conventional methods, the Bi—Sr—Ca—Cu—O superconductor prepared by the process of the present invention has a high critical temperature and exhibits superior superconductivity. With respect to the above two types of sintered product samples, the structural analysis was conducted by the X-ray diffraction method, and they were considered to be polymorphic. However, the intensity in the X-ray diffraction was distinctly stronger with the product prepared by the process of the present invention, thus indicating that the crystallization was advanced.

Further, with respect to each sample obtained in Example 5 and Comparative Example 9, the susceptibility was measured, whereby the Meissner effects were confirmed in each case at the offset temperature.

EXAMPLE 6

So as to bring the composition of the desired Tl—Ca—Ba—Cu—O superconductor to $Tl_2Ca_2Ba_2Cu_3O_y$, thallium methoxide TlOMe, calcium acetate $Ca(CH_3COO)_2$, barium isopropoxide $Ba(Oi-Pr)_3$ and copper acetylacetonate $Cu(CH_3COCHCOCH_3)_2$ were added in a predetermined molar ratio in a total amount of 4 g in 500 ml of isopropanol. Further, 10 ml of diethylamine was added thereto to obtain a mixed solution. The solution was refluxed for 24 hours. Then, 15 ml of distilled water was slowly added thereto, and the mixture was refluxed for 24 hours for hydrolysis, whereby an amorphous mixture of Tl, Ca, Ba and Cu was formed. Isopropanol was removed, and the mixture was dried at 300° C. and formed into a pellet by means of a pelletizer. This pellet was sintered in an oxygen stream at 900° C. for 10 minutes to obtain a densely sintered product. The temperature dependency of the resistance of this sintered product was measured by a DC four terminal method, whereby the results shown by the characteristic curve O in FIG. 6 were obtained. It was found that the resistance became 0 at 103 K.

A study was made by changing the sintering temperature to 500° C., 700° C. and 800° C., whereby it was found that even at 700° C., the crystallization proceeded adequately.

COMPARATIVE EXAMPLE 10

For the purpose of comparison, a mixture of $Tl_2O$, $CaO$, $BaO$ and $CuO$ powders which are all guaranteed reagents, was sintered in the same manner as in Example 6 to obtain a sintered product.

Figure 6:
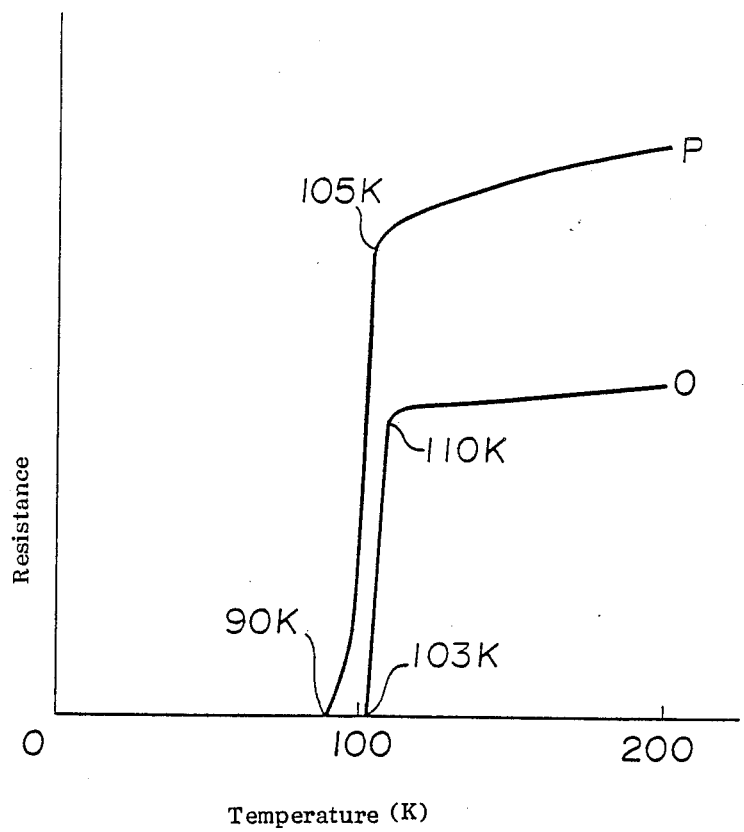
FIG. 6 is a graph showing the relation between the resistivity and the temperature of superconductors of an oxide system obtained in Example 6 (curve 0) and Comparative Example 10 (curve P).

The temperature dependency of the resistance of the sintered product was as shown by characteristic curve P in FIG. 6. It was found that the resistance became 0 at 90 K.

From the above comparison, it is evident that as compared with the product of the conventional dry method, the superconductor of an oxide system obtained by the present invention is excellent not only in the superconducting characteristics but also in that the sintering can be conducted at a relatively low temperature. From the X-ray diffraction intensity, it was found that when the same sintering process was employed, the crystallization proceeded further by the present invention as compared with the conventional dry method.

In the above Example, the preparation of a superconductor of an oxide system was described with respect to a case wherein the molar ratio of Tl, Ca, Ba and Cu was 2:2:2:3. However, the present invention is not limited to a such specific molar ratio, and similar effects can be obtained with other molar ratios.

What is claimed is:

1. A process for producing a superconductor of an oxide system containing metal elements in accordance with the formula:

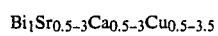

$Bi_1Sr_{0.5-3}Ca_{0.5-3}Cu_{0.5-3.5}$ which process comprises:
(a) uniformly dissolving, dispersing or suspending metal elements for constituting the oxide system in a solvent at least partly in the form of carboxylates, and in the presence of an oxidizing agent selected from the group consisting of hydrogen peroxide, benzoyl peroxide, peracetic acid, perbenzoic acid, ozone and m-chloroperbenzoic acid; and (b) removing the solvent to obtain a homogenous mixture, and sintering the mixture in an oxygen atmosphere.

2. The process according to claim 1, which further comprises presintering said mixture prior to sintering said mixture.

3. The process according to claim 1, wherein said sintering step is conducted in an atmosphere which is at least 50% oxygen.

4. The process according to claim 1, which further comprises subjecting said mixture, after sintering, to oxygen gas plasma treatment.

5. The process according to claim 1, wherein the remainder of said metal elements for constituting said oxide system are uniformly dissolved, dispersed or suspended in said solvent in the form of alkoxides, acetylacetonates or inorganic compounds or a combination thereof.

6. The process according to claim 1, wherein the uniformly dissolved, dispersed or suspended mixture is hydrolyzed prior to the removal of said solvent.

7. The process according to claim 1, wherein said solvent is used in an amount of about 10 times the total amount of the carboxylates.

8. The process according to claim 1, which further comprises effecting a presintering step prior to sintering.

9. The process according to claim 1, wherein said solvent is removed by the application of reduced pressure.

10. The process according to claim 2, wherein said sintering step comprises heating said mixture from about 850° to 1,000° C. for about 4 to 10 hours.

11. The process according to claim 4, wherein said oxygen gas plasma treatment is effected with an oxygen gas pressure of about 1 mb, using a power of about 30 to 100 W and for a time of from 0.5 to 3 hours.

12. The process according to claim 10, wherein said sintering step comprises heating said mixture from about 900° to 950° C.

* * * * *